(12) United States Patent
Nakamura et al.

(10) Patent No.: US 6,873,034 B2
(45) Date of Patent: Mar. 29, 2005

(54) SOLID-STATE IMAGING DEVICE, METHOD FOR PRODUCING SAME, AND MASK

(75) Inventors: Masao Nakamura, Nara (JP); Kazumasa Doi, Hiroshima (JP); Kouji Shidahara, Hiroshima (JP)

(73) Assignees: Sharp Kabushiki Kaisha, Osaka (JP); Sun-S Co. Ltd., Hiroshima (JP)

( * ) Notice: Subject to any disclaimer, the term of this patent is extended or adjusted under 35 U.S.C. 154(b) by 50 days.

(21) Appl. No.: 10/370,403

(22) Filed: Feb. 19, 2003

(65) Prior Publication Data

US 2003/0155639 A1 Aug. 21, 2003

(30) Foreign Application Priority Data

Feb. 20, 2002 (JP) ........................................ 2002-043829

(51) Int. Cl.$^7$ .............................................. H01L 23/02
(52) U.S. Cl. .................. 257/680; 257/686; 257/777; 257/787; 257/460; 257/431; 438/116; 438/106; 438/25; 438/26
(58) Field of Search ................................ 257/680, 686, 257/777, 787, 782, 783, 460, 431, 415; 438/116, 106, 25, 26

(56) References Cited

U.S. PATENT DOCUMENTS 5,729,038 A * 3/1998 Young et al. ............... 257/460

6,472,247 B1 * 10/2002 Andoh et al. ................. 438/64
6,498,115 B1 * 12/2002 Yumoto ....................... 438/784
2004/0018662 A1 * 1/2004 Goto .......................... 438/109

FOREIGN PATENT DOCUMENTS

| JP | 6-204442 | | 7/1994 | |
| JP | 10-256470 | | 9/1998 | |
| JP | 11224883 A | * | 8/1999 | ........... H01L/21/56 |
| JP | 11251340 A | * | 9/1999 | ........... H01L/21/56 |
| JP | 2002280400 A | * | 9/2002 | ........... H01L/21/56 |
| WO | WO 97/02596 | | 1/1997 | |

* cited by examiner

*Primary Examiner*—Nathan J. Flynn
*Assistant Examiner*—Remmon R. Fordé
(74) *Attorney, Agent, or Firm*—Edwards & Angell, LLP; David G. Conlin; George W. Hartnell, III (57) ABSTRACT

The present invention provides a solid-state imaging device comprising: a transparent substrate transmitting light therethrough; a first chip including a solid-state imaging element having a light receiving portion; a first resin providing airtight sealing between the first chip and the transparent substrate; a second chip opposite to the transparent substrate with respect to the first chip; and second resin die bonding the second chip to the first chip, wherein the first resin and the second resin are made of the same material.

9 Claims, 6 Drawing Sheets

SOLID-STATE IMAGING DEVICE, METHOD FOR PRODUCING SAME, AND MASK

BACKGROUND OF THE INVENTION

1. Field of the Invention

The present invention relates to a solid-state imaging device in which airtight sealing is provided between a transparent substrate and a solid-state imaging element, a method for producing the same device, and a mask which can be used for producing the same device.

2. Description of the Related Art

In recent years, the number of solid-state imaging devices mounted on a portable information apparatus is increasing. A solid-state imaging device mounted on a portable information apparatus includes a solid-state imaging element having a light receiving portion. The solid-state imaging element converts light from an object, which is incident on the light receiving portion, into an image signal. A peripheral integrated circuit for processing the image signal converted by the solid-state imaging element is mounted on the solid-state imaging element. The thus-configured solid-state imaging device is required to be sufficiently light-weighted, thin, and compact to be mounted on a portable information apparatus.

Figure 16:
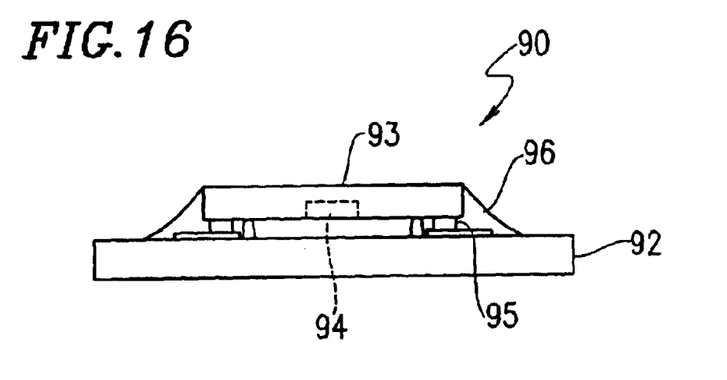
FIG. 16 is a cross-sectional view of a conventional solid-state imaging device.

Japanese Laid-Open Patent Publication No. 6-204442 discloses a solid-state imaging device configured to provide airtight sealing between a transparent substrate and a solid-state imaging element which is included in the solid-state imaging device such that a light receiving portion of the solid-state imaging element is opposed to the transparent substrate. FIG. 16 is a cross-sectional view of a conventional solid-state imaging device 90. The solid-state imaging device 90 includes a transparent substrate 92 which transmits light therethrough. A rectangular parallelepiped-like solid-state imaging element 93 is mounted on the transparent substrate 92. On the side of a surface of the solid-state imaging element 93 which is opposed to the transparent substrate 92, a light receiving portion 94 including a plurality of photodiodes is provided in the solid-state imaging element 93. A protruding electrode 95, which electrically connects conductor wires formed on the transparent substrate 92 to the solid-state imaging element 93, is located on the same surface of the solid-state imaging element 93. The light receiving portion 94 of the solid-state imaging element 93 is provided so as to be opposed to the transparent substrate 92, i.e., the solid-state imaging element 93 is mounted face-down on the transparent substrate 92. A sealing resin 96 for providing airtight sealing between the solid-state imaging element 93 and the transparent substrate 92 is formed around the periphery of the solid-state imaging element 93.

The thus-configured solid-state imaging device 90 is produced in the following manner. Firstly, the protruding electrode 95 on the solid-state imaging element 93 is connected to the conductor wires formed on the transparent substrate 92, such that the light receiving portion 94 is opposed to the transparent substrate 92. The solid-state imaging element 93 is bonded face-down to the transparent substrate 92. The sealing resin 96 for providing airtight sealing between the solid-state imaging element 93 and the transparent substrate 92 is dispensed along the periphery of the solid-state imaging element 93. Next, the sealing resin 96 dispensed along the periphery of the solid-state imaging element 93 is cured so as to provide airtight sealing between the solid-state imaging element 93 and the transparent substrate 92. Note that a printing technique may be employed for applying the sealing resin 96 to the solid-state imaging element 93, which is mounted face-down on the transparent substrate 92 and is covered by a mask, along the periphery of the solid-state imaging element 93.

In the thus-configured solid-state imaging device 90, light incident on the transparent substrate 92 from a surface opposite to that opposed to the solid-state imaging element 93 is transmitted through the transparent substrate 92 and then enters the light receiving portion 94 provided in the solid-state imaging element 93. The solid-state imaging element 93 converts the incident light, which has entered the light receiving portion 94, into an image signal and outputs the image signal from an output terminal (not shown).

Figure 17:
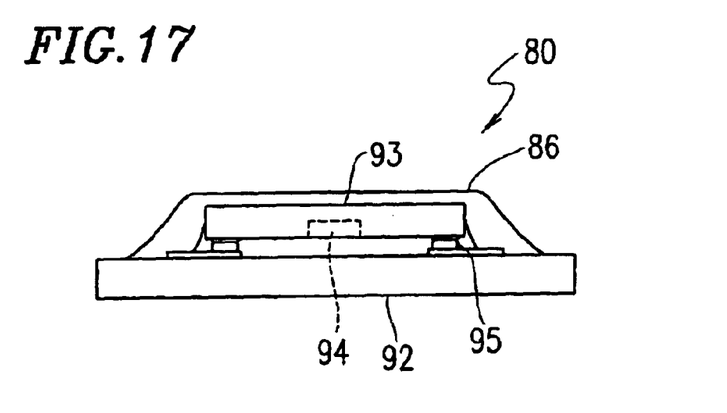
FIG. 17 is a cross-sectional view of another conventional solid-state imaging device.

International publication WO 97/02596 pamphlet discloses a solid-state imaging device 80 configured to provide airtight sealing between a transparent substrate and a solid-state imaging element which is included in the solid-state imaging device such that a light receiving portion of the solid-state imaging element is opposed to the transparent substrate. FIG. 17 is a cross-sectional view of the solid-state imaging device 80. In FIG. 17, elements similar to those described in conjunction with the solid-state imaging device 90 and with reference to FIG. 16 are denoted by the same reference numerals, and detailed description thereof will be omitted. The solid-state imaging device 80 of FIG. 17 differs from the solid-state imaging device 90 of FIG. 16 in that a sealing resin 86 for providing airtight sealing between the solid-state imaging element 93 and the transparent substrate 92 is formed so as to continuously cover both of the periphery of the solid-state imaging element 93 and a surface of the solid-state imaging element 93 opposite to that opposed to the transparent substrate 92.

The thus-configured solid-state imaging device 80 is produced in the following manner. Firstly, as in the case of the solid-state imaging device 90 of FIG. 16, the protruding electrode 95 on the solid-state imaging element 93 is connected to conductor wires formed on the transparent substrate 92, such that the light receiving portion 94 is opposed to the transparent substrate 92. The solid-state imaging element 93 is bonded face-down to the transparent substrate 92. The sealing resin 86 for providing airtight sealing between the solid-state imaging element 93 and the transparent substrate 92 is dispensed so as to completely cover the solid-state imaging element 93. Next, the sealing resin 86 continuously applied to the solid-state imaging element 93 along the periphery thereof and on a surface thereof which is not opposed to the transparent substrate 92 is cured so as to provide airtight sealing between the solid-state imaging element 93 and the transparent substrate 92.

Figure 18:
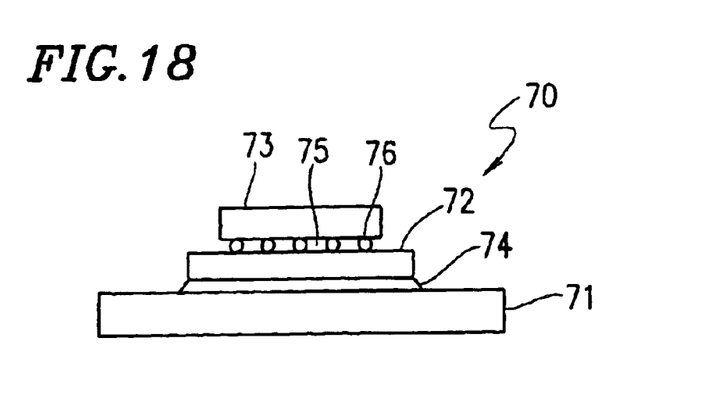
FIG. 18 is a cross-sectional view of still another conventional solid-state imaging device.

Japanese Laid-Open Patent Publication No. 10-256470 discloses still another conventional solid-state imaging device configured such that a second semiconductor chip adheres to a first semiconductor chip adhering to an island-shaped layer. FIG. 18 is a cross-sectional view of a solid-state imaging device 70 disclosed in the above-mentioned publication. The solid-state imaging device 70 includes an island-shaped layer 71. A first semiconductor chip 72 adheres to the island-shaped layer 71 via a first adhesive 74. A second semiconductor chip 73 adheres to the first semiconductor chip 72 via a second adhesive 75. The second adhesive 75 contains spherical silicon particles (a filler) 99 each having a particle size of 20 microns to 40 microns.

However, in the configurations of the solid-state imaging devices 80 and 90 shown in FIGS. 17 and 16, respectively, in order to mount a peripheral integrated circuit for processing an image signal converted by the solid-state imaging element 93 on the solid-state imaging element 93, as described above, the number of steps required is increased. Specifically, it is necessary to perform the steps of: applying a die bond paste for die bonding a peripheral integrated circuit to the solid-state imaging element 93 after the sealing resin 96 for providing airtight sealing between the solid-state imaging element 93 and the transparent substrate 92 is cured; and curing the die bond paste after the peripheral integrated circuit is die bonded to the solid-state imaging element 93.

Further, in order to prevent the die bond paste from contaminating the top surface of the peripheral integrated circuit and from adhering to a die bond tool, the amount of the die bond paste is required to be controlled according to the outer shape of the peripheral integrated circuit to be die bonded.

In the configuration of the solid-state imaging device 70 of FIG. 18, in addition to the step of applying the first adhesive 74 to the island-shaped layer 71, it is necessary to perform the step of applying the second adhesive 75 containing the filler 99 having relatively low viscosity to the first semiconductor chip 72. That is, it is necessary to perform two steps for separately applying different types of adhesives, thereby increasing the number of steps required.

SUMMARY OF THE INVENTION

According to one aspect of the present invention, there is provided a solid-state imaging device comprising: a transparent substrate transmitting light therethrough; a first chip including a solid-state imaging element having a light receiving portion; a first resin providing airtight sealing between the first chip and the transparent substrate; a second chip opposite to the transparent substrate with respect to the first chip; and a second resin die bonding the second chip to the first chip, wherein the first resin and the second resin is made of the same material.

In one embodiment of the invention, the first resin covers the first chip around side surfaces thereof.

In another embodiment of the invention, the second chip includes a processing circuit for processing a signal converted by the solid-state imaging element.

In still another embodiment of the invention, the first chip further includes a protruding electrode electrically connecting the solid-state imaging element included in the first chip and the transparent substrate together.

In still another embodiment of the invention, the light receiving portion is opposed to the transparent substrate.

According to another aspect of the present invention, there is provided a method for producing a solid-state imaging device, the method comprising the steps of: mounting a first chip on a transparent substrate transmitting light therethrough, the first chip including a solid-state imaging element having a light receiving portion; placing a mask, which includes a recess portion for housing the first chip therein, a first opening, and a second opening, on the transparent substrate, such that the first chip is housed in the recess portion and prevents passage between the first and second openings, and thereafter injecting the same resin through the first and second openings to form first and second resins such that the first resin provides airtight sealing between the first chip and the transparent substrate and the second resin is separated from the first resin; die bonding the second chip to the first chip using the second resin; and curing each of the first resin and the second resin after die bonding of the second chip.

According to still another aspect of the present invention, there is provided a mask covering a chip mounted on a transparent substrate, the mask comprising: a recess portion for housing the chip therein; a first opening through which a first resin for providing airtight sealing between the chip and the transparent substrate is injected into the recess portion; and a second opening through which a second resin is injected so as to be separated from the first resin, wherein the chip prevents passage between the first and second openings.

Thus, the invention described herein makes possible the advantages of providing: (1) a solid-state imaging device capable of keeping the number of steps added for mounting a peripheral integrated circuit on a solid-state imaging element to a minimum; (2) a method for producing the same device; and (3) a mask which can be used for producing the same device.

These and other advantages of the present invention will become apparent to those skilled in the art upon reading and understanding the following detailed description with reference to the accompanying figures.

DESCRIPTION OF THE PREFERRED EMBODIMENTS

In a solid-state imaging device according to an embodiment of the present invention, a peripheral integrated circuit for processing an image signal generated by a solid-state imaging element mounted face-down on a transparent substrate is mounted on the solid-state imaging element.

Figure 1:
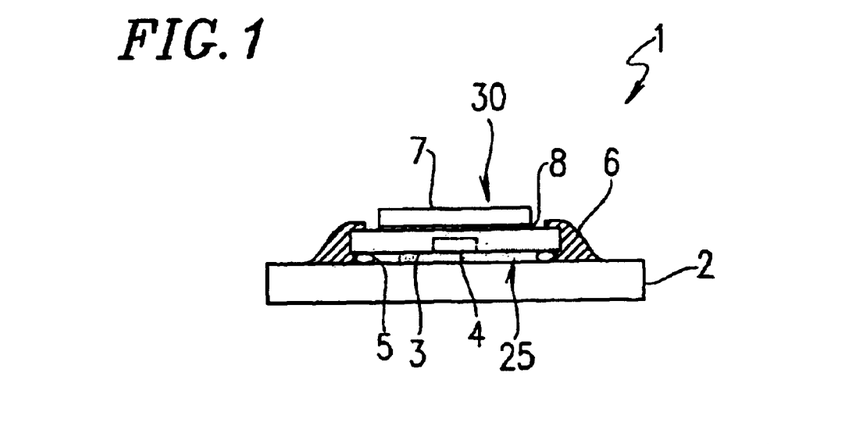
FIG. 1 is a cross-sectional view of a solid-state imaging device according to an embodiment of the present invention.
Figure 2:
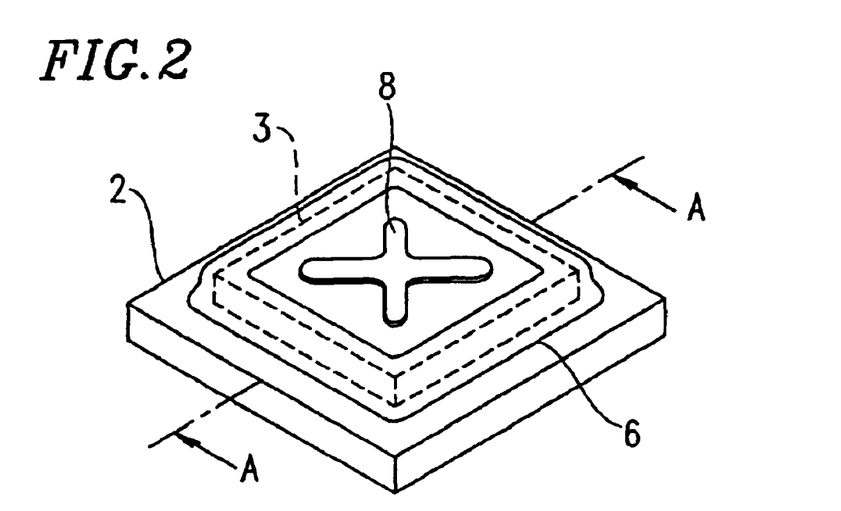
FIG. 2 is a perspective view of the solid-state imaging device of FIG. 1 without a peripheral integrated circuit.
Figure 3:
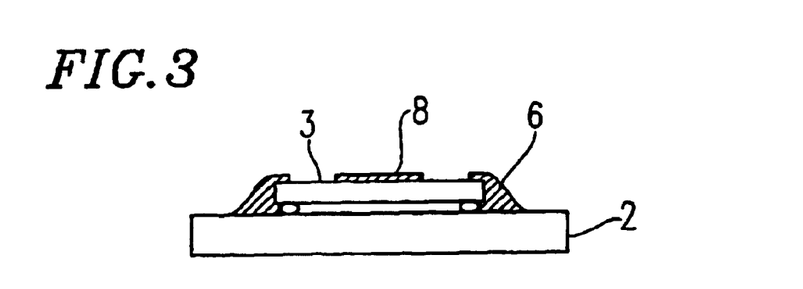
FIG. 3 is a cross-sectional view of the solid-state imaging device of FIG. 1 without a peripheral integrated circuit.

FIG. 1 is across-sectional view of a solid-state imaging device 1 according to an embodiment of the present invention. FIG. 2 is a perspective view of the solid-state imaging device 1 without a peripheral integrated circuit 7. FIG. 3 is across-sectional view of the solid-state imaging device 1 taken along line A—A of FIG. 2.

The solid-state imaging device 1 includes a transparent substrate 2 which transmits light therethrough. The transparent substrate 2 has a thickness of 0.5 mm or more to 0.7 mm or less and is made of glass or the like. A chip 25 is mounted on the transparent substrate 2. The chip 25 includes a substantially square-shaped plate-like solid-state imaging element 3 and a protruding electrode 5 for electrically connecting conductor wires formed on the transparent substrate 2 with the solid-state imaging element 3. On the side of a surface of the solid-state imaging element 3 which is opposed to the transparent substrate 2, a light receiving portion 4 including a plurality of photodiodes is provided in the solid-state imaging element 3. In the solid-state imaging element 3 shown in FIG. 1, the light receiving portion 4 is provided in the substantial center of the surface opposed to the transparent substrate 2, and the protruding electrode 5 is provided in a peripheral portion of the same surface. The solid-state imaging element 3 converts light, which is transmitted through the transparent substrate 2 and is incident on the light receiving portion 4, into an image signal and outputs the image signal from an output terminal (not shown). As described above, the light receiving portion 4 of the solid-state imaging element 3 is provided so as to be opposed to the transparent substrate 2, i.e., the solid-state imaging element 3 is mounted face-down on the transparent substrate 2. A sealing resin 6 for providing airtight sealing between the solid-state imaging element 3 and the transparent substrate 2 is formed along the periphery of the solid-state imaging element 3, so as to cover the sides of the solid-state imaging element 3, edge portions of the top surface thereof, and gaps between the solid-state imaging element 3 and the top surface of the transparent substrate 2.

A die bond resin 8 is formed in the center portion of the top surface of the solid-state imaging element 3 in the diagonal directions so as to have a cross-like shape, as shown in FIG. 2. The die bond resin 8 is made of the same material as that of the sealing resin 6. Referring to FIG. 1, a chip 30 is provided on the die bond resin 8. The chip 30 includes a peripheral integrated circuit 7 having a substantially rectangular parallelepiped shape. The peripheral integrated circuit 7 processes an image signal output from an output terminal (not shown) of the solid-state imaging element 3. In this manner, the peripheral integrated circuit 7 is die bonded to the top surface of the solid-state imaging element 3 using the bond resin 8.

Figure 4:
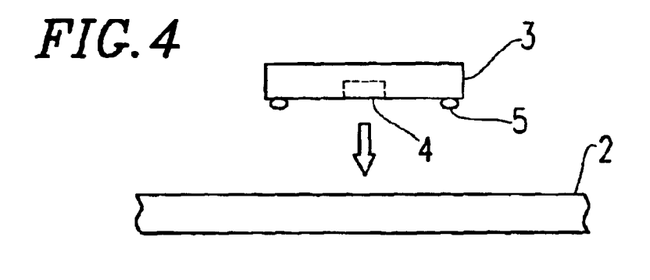
FIG. 4 is a cross-sectional view for explaining a method for producing a solid-state imaging device according to an embodiment of the present invention.
Figure 5:
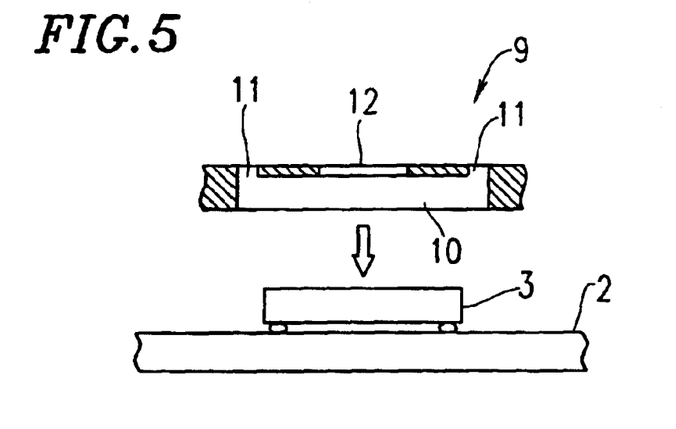
FIG. 5 is another cross-sectional view for explaining a method for producing a solid-state imaging device according to an embodiment of the present invention.

The thus-configured solid-state imaging device 1 is produced in the following manner. FIGS. 4 and 5 are cross-sectional views for explaining a method for producing the solid-state imaging device 1. Referring to FIG. 4, the solid-state imaging element 3 is bonded face-down to the transparent substrate 2 by connecting the protruding electrode 5 on the solid-state imaging element 3 to conductor wires formed on the transparent substrate 2, such that the light receiving portion 4 provided in the solid-state imaging element 3 is opposed to the transparent substrate 2.

Figure 6:
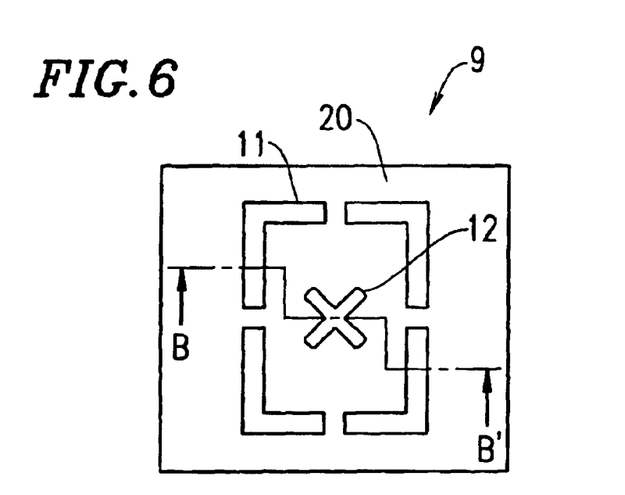
FIG. 6 is a top view of a resin application mask for use introducing a solid-state imaging device according to an embodiment of the present invention.
Figure 7:
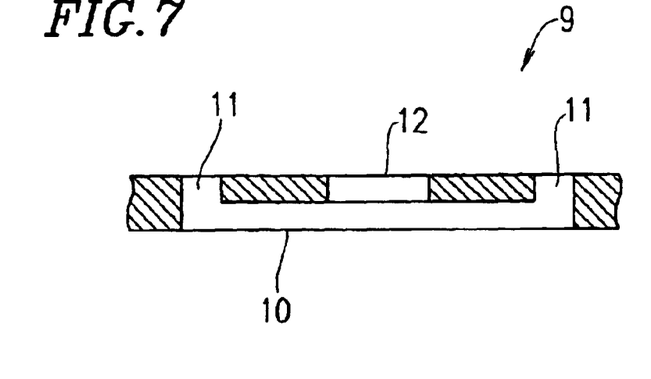
FIG. 7 is a cross-sectional view of the resin application mask shown in FIG. 6.

In this state, a mask 9 for use in application of the sealing resin 6 and the die bond resin 8 is provided so as to cover the solid-state imaging element 3 mounted face-down on the transparent substrate 2, as shown in FIG. 5. FIG. 6 is a top view for explaining the mask 9. FIG. 7 is a cross-sectional view of the mask 9 taken along line B–B' shown in FIG. 6. The mask 9 includes a recess portion 10 for housing the solid-state imaging element 3 therein. The recess portion 10 is provided forming a hollow space, which is open to the transparent substrate 2, so as to keep a certain space between the solid-state imaging element 3 and the mask 9 when the chip 25 is covered with the mask 9. In the state where the solid-state imaging element 3 mounted on the transparent substrate 2 is housed in the recess portion 10, a surface of the mask 9, which is opposed to the transparent substrate 2, is in close contact with the top surface of the transparent substrate 2, and a surface of the recess portion 10, which is opposed to the solid-state imaging element 3, is in close contact with the top surface of the solid-state imaging element 3.

The mask 9 has four openings 11 for application of sealing resin such that the sealing resin 6 can be supplied from the top surface of the mask 9 into the recess portion 10. When the mask 9 is placed so as to cover the chip 25 mounted on the transparent substrate 2, part of the transparent substrate 2 and side surfaces of the solid-state imaging element 3 are exposed in the recess portion 10 through each opening 11 for application of sealing resin to the outside. In this arrangement, when supplying the sealing resin 6 from the top surface of the mask 9 through each opening 11 for application of sealing resin to the recess portion 10, the sealing resin 6 is applied to the solid-state imaging element 3 and the transparent substrate 2 along the periphery of the solid-state imaging element 3, thereby providing airtight sealing between the solid-state imaging element 3 and the transparent substrate 2. In the case where the recess portion 10 has a rectangular parallelepiped shape, the sealing resin 6 is applied to the solid-state imaging element 3 and the transparent substrate 2 along L-like portions around side edges of the solid-state imaging element 3, i.e., around at least four corners among eight corners of the rectangular parallelepiped-shaped recess portion 10, which are in contact with the transparent substrate 2.

Further, the mask 9 has an opening 12 for application of die bond resin which is formed such that the die bond resin 8 is applied therethrough to the solid-state imaging element 3 in the center portion of the top surface thereof. When the mask 9 is placed so as to cover the chip 25 mounted on the transparent substrate 2, at least a part of the solid-state imaging element 3 is exposed through the opening 12 for application of die bond resin. In the present embodiment, the opening 12 for application of die bond resin is formed in the center portion of the surface of the recess portion 10 opposed to the solid-state imaging element 3. Furthermore, the opening 12 for application of die bond resin is formed in the diagonal directions so as to have a cross-like shape. When the mask 9 is placed so as to cover the chip 25 mounted on the transparent substrate 2, passage between each opening 11 for application of sealing resin and the opening 12 for application of die bond resin is prevented by the chip 25.

Figure 8:
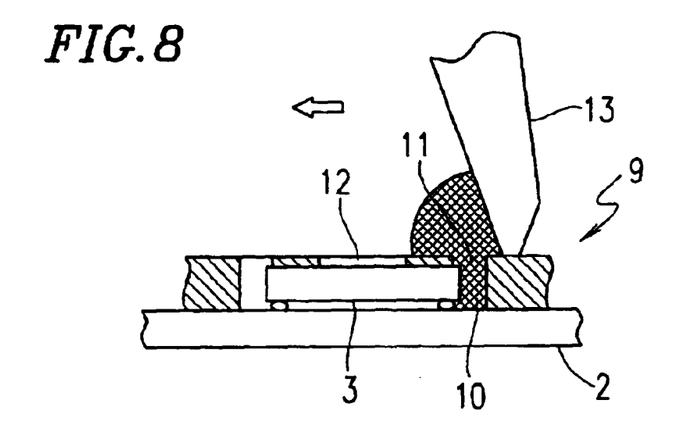
FIG. 8 is still another cross-sectional view for explaining a method for producing a solid-state imaging device according to an embodiment of the present invention.

FIG. 8 is a cross-sectional view for explaining the step of applying resin to the solid-state imaging element 3 covered by the mask 9. Resin, which has a thixotropic ratio adjusted so as to have high viscosity, is poured through the opening 11 for application of sealing resin into the recess portion 10 and the openings 12 for application of die bond resin using a squeegee 13. The recess portion 10 has been previously subjected to counter boring such that the solid-state imaging element 3 can be housed in the recess portion 10 and the surface of the mask 9, which is opposed to the transparent substrate 2, can be in close contact with the top surface of the transparent substrate 2. Therefore, the resin poured into the recess portion 10 will never flow between the transparent substrate 2 and the mask 9 to the outside of the recess portion 10. Since the surface of the recess portion 10, which is opposed to the solid-state imaging element 3, is in close contact with the top surface of the solid-state imaging element 3, resin can be separately injected through the openings 11 for application of sealing resin and the opening 12 for application of die bond resin by laterally moving the squeegee 13. The amount of resin applied between the solid-state imaging element 3 and the transparent substrate 2 can be controlled by adjusting printing pressure applied by the squeegee 13.

Figure 9:
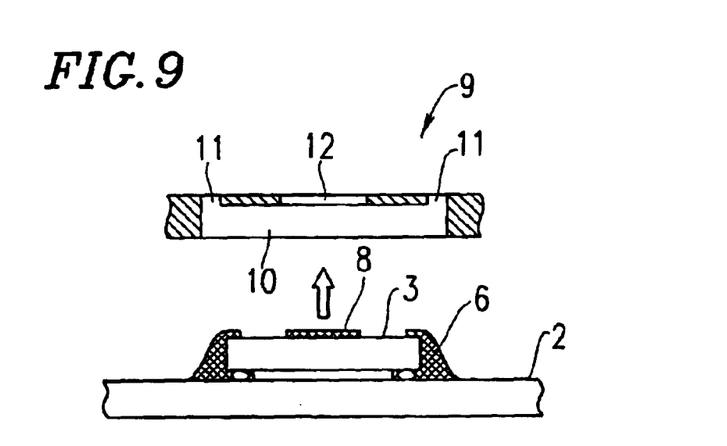
FIG. 9 is still another cross-sectional view for explaining a method for producing a solid-state imaging device according to an embodiment of the present invention.

FIG. 9 is a cross-sectional view for explaining the state where the mask 9 is removed after resin has been applied to the solid-state imaging element 3. When the mask 9 is removed from the solid-state imaging element 3, the resin applied to the solid-state imaging element 3 remains in areas, such as side surfaces of the solid-state imaging element 3, edge portions and a center portion of the top surface thereof, and portions of the top surface of the transparent substrate 2. The sealing resin 6 for providing airtight sealing between the solid-state imaging element 3 and the transparent substrate 2 corresponds to the resin remaining in areas, such as the side surfaces of the solid-state imaging element 3, the edge portions of the top surface thereof, and the portions of the top surface of the transparent substrate 2. The die bond resin 8, which functions as a die bond paste for die bonding the peripheral integrated circuit 7 to the solid-state, imaging element 3, corresponds to the resin remaining in the center portion of the top surface of the solid-state imaging element 3. In this manner, the sealing resin 6 for providing airtight sealing between the solid-state imaging element 3 and the transparent substrate 2 and the die bond resin 8 for die bonding the peripheral integrated circuit 7 to the solid-state imaging element 3 are applied at the same time.

Figure 10:
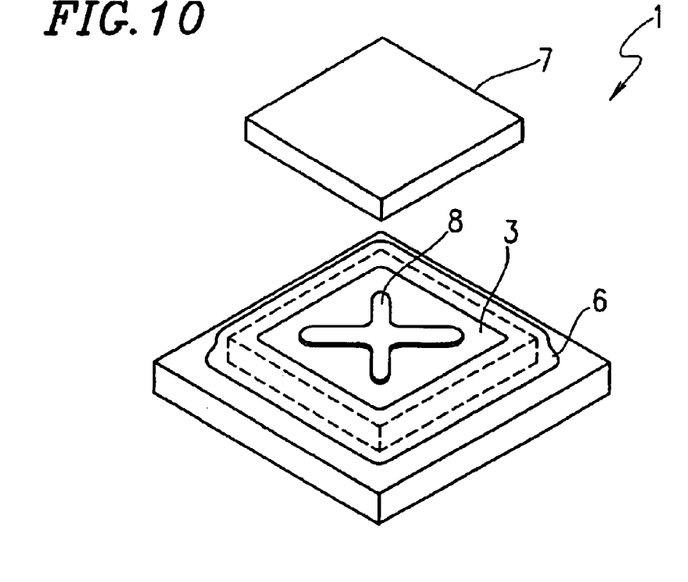
FIG. 10 is a perspective view for explaining a method for producing a solid-state imaging device according to an embodiment of the present invention.

FIG. 10 is a perspective view for explaining the step of mounting the peripheral integrated circuit 7 face-up on the solid-state imaging element 3. In order to die bond the peripheral integrated circuit 7 to the solid-state imaging element 3, the peripheral integrated circuit 7 is placed on the die bond resin 8 formed on the top surface of the solid-state imaging element 3. Thereafter, the sealing resin 6 and the die bond resin 8 are cured at the same time. Since the sealing resin 6 and the die bond resin 8 are made of the same material, the curing step is only required to be performed once. Thus, the solid-state imaging device 1 is completed.

Figure 11:
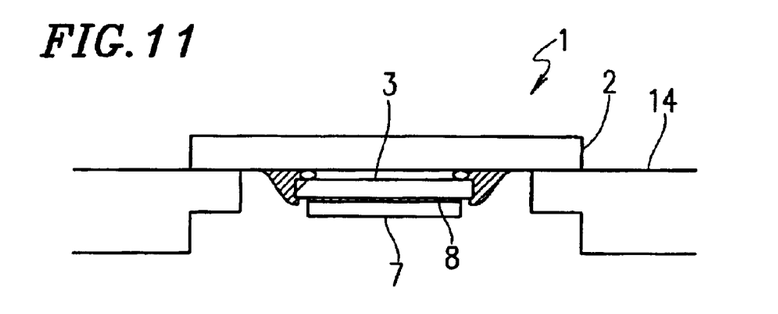
FIG. 11 is across-sectional view for explaining a method for mounting a solid-state imaging device according to an embodiment of the present invention on a circuit board.
Figure 12:
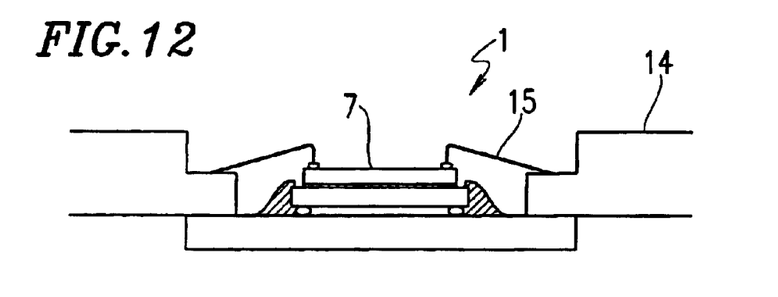
FIG. 12 is another cross-sectional view for explaining a method for mounting a solid-state imaging device according to an embodiment of the present invention on a circuit board.
Figure 13:
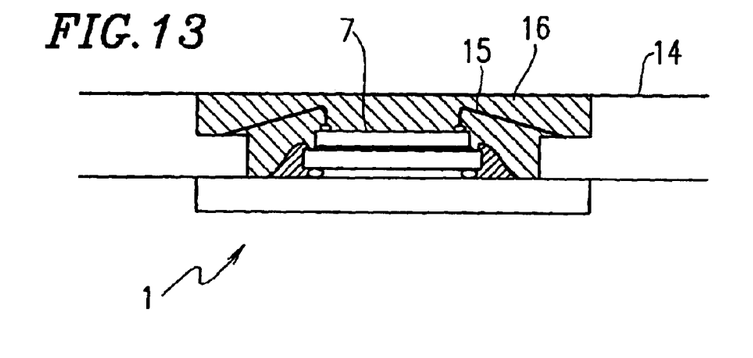
FIG. 13 is still another cross-sectional view for explaining a method for mounting a solid-state imaging device according to an embodiment of the present invention on a circuit board.

FIGS. 11 through 13 are cross-sectional views for explaining a method for mounting the solid-state imaging device 1 on a circuit board 14. Referring to FIG. 11, the circuit board 14 made of ceramics has an opening formed in the top surface thereof. The solid-state imaging device 1 is mounted on the circuit board 14 by fixing the transparent substrate 2 on the top surface of the circuit board 14 such that the solid-state imaging element 3 and the peripheral integrated circuit 7 are placed within the opening formed in the top surface of the circuit board 14.

Next, referring to FIG. 12, the circuit board 14 having the solid-state imaging device 1 mounted thereon is turned over, and the peripheral integrated circuit 7 provided in the solid-state imaging device 1 is connected to the circuit board 14 via a wire bonding 15. Referring to FIG. 13, the opening in which the wire bonding 15 for connecting the peripheral integrated circuit 7 provided in the solid-state imaging device 1 to the circuit board 14 is formed is sealed by a resin potting 16.

Although the example where the chip 25 includes the protruding electrode 5 located on the solid-state imaging element 3 is described above, the present invention is not limited to this. The protruding electrode 5 can be provided to the transparent substrate 2 so long as the protruding electrode 5 electrically connects the transparent substrate 2 and the solid-state imaging element 3 together.

Further, although the example where the transparent substrate 2 is made of glass or the like is described above, the transparent substrate 2 can be an optical filter or the like. Moreover, the circuit board 14 can be a printed wiring board (PWB) or a flexible printed circuit (FPC).

As described, according to the present embodiment, the sealing resin 6 for providing airtight sealing between the solid-state imaging element 3 and the transparent substrate 2 is made of the same material as that for the die bond resin 8 for die bonding the peripheral integrated circuit 7 to the solid-state imaging element 3, and therefore the sealing resin 6 and the die bond resin 8 can be applied in the same application step and can be cured in the same curing step.

Accordingly, it is not necessary to additionally perform the steps of: applying a die bond paste for die bonding a peripheral integrated circuit to a solid-state imaging element after the sealing resin is cured; and curing the die bond paste after the peripheral integrated circuit is die bonded to the solid-state imaging element.

Consequently, it is possible to keep the number of steps required for mounting the peripheral integrated circuit on the solid-state imaging element to a minimum. It is also possible to employ a simpler production process for producing a solid-state imaging device having a laminated structure in which the peripheral integrated circuit is mounted on the solid-state imaging element. Therefore, it is possible to provide a solid-state imaging device, which is expected to become more compact and thinner in the future, at low cost.

Figure 14:
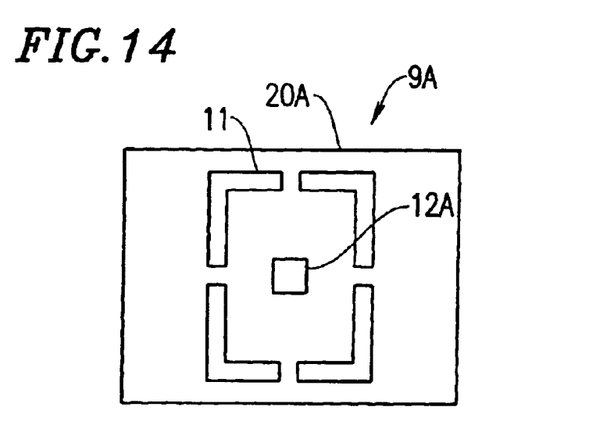
FIG. 14 is a top view of another resin application mask for use in producing a solid-state imaging device according to an embodiment of the present invention.
Figure 15:
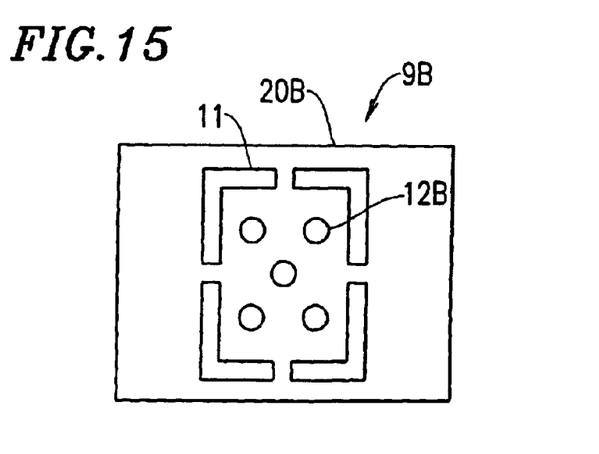
FIG. 15 is a top view of still another resin application mask for use in producing a solid-state imaging device according to an embodiment of the present invention.

Note that the shape of the opening 12 for application of die bond resin formed in a resin application mask is not limited to that shown in FIG. 6. For example, as shown in FIGS. 14 and 15, the opening 12 for application of die bond resin may be formed in any shape according to the pattern of applying die bond resin to the top surface of a solid-state imaging element. FIG. 14 is a top view of another resin application mask 9A for use in producing the solid-state imaging device 1 according to the present embodiment. As shown in FIG. 14, a square-shaped opening 12A for application of die bond resin may be formed. FIG. 15 is a top view of still another resin application mask 9B for use in producing the solid-state imaging device 1. As shown in FIG. 15, a plurality of circular openings 12B for application of die bond resin may be formed.

Although the present invention has been described above with respect to the case where a light-receiving portion of a solid-state imaging element included in a chip is opposed to a transparent substrate when the chip is mounted on the transparent substrate, the present invention is not limited to this. The present invention is applicable to a chip including a predetermined transparent member between the light-receiving portion and the transparent substrate.

As described above, according to the present invention, it is possible to provide: a solid-state imaging device capable of keeping the number of steps added for mounting a peripheral integrated circuit on a solid-state imaging element to a minimum; a method for producing the same device; and a mask which can be used for producing the same device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state imaging device, comprising:
   a transparent substrate transmitting light therethrough;
   a first chip having sides, a top portion, and a periphery including a solid-state imaging element having a light receiving portion;
   a first resin providing airtight sealing between the first chip and the transparent substrate;
   a second chip opposite to the transparent substrate with respect to the first chip; and
   a second resin die bonding the second chip to the first chip,
   wherein the first resin and the second resin are made of the same material, and wherein the airtight sealing of the first resin is formed along the periphery of the first chip so as to cover the sides of said first chip, edge portions of the top portion of said first chip, and gaps between said first chip and the transparent substrate.

2. A solid-state imaging device according to claim 1, wherein the second chip includes a processing circuit for processing a signal converted by the solid-state imaging element.

3. A solid-state imaging device according to claim 1, wherein the first chip further includes a protruding electrode electrically connecting the solid-state imaging element included in the first chip and the transparent substrate together.

4. A solid-state imaging device according to claim 1, wherein the light receiving portion is opposed to the transparent substrate.

5. A method for producing a solid-state imaging device, comprising the steps of:
   mounting a first chip on a transparent substrate transmitting light therethrough, the first chip including a solid-state imaging element having a light receiving portion, sides, a top portion, and a periphery;
   placing a mask, which includes a recess portion for housing the first chip therein, a first opening, and a second opening, on the transparent substrate, such that the first chip is housed in the recess portion and prevents passage between the first and second openings, and thereafter injecting the same resin through the first and second openings to form first and second resins such that the first resin provides airtight sealing between the first chip and the transparent substrate and the second resin is separated from the first resin;
   die bonding the second chip to the first chip using the second resin; and
   curing each of the first resin and the second resin after die bonding of the second chip,
   wherein the airtight sealing of the first resin is formed along the periphery of the first chip so as to cover the sides of said first chip, edge portions of the top portion of said first chip, and gaps between said first chip and the transparent substrate.

6. A mask covering a chip mounted on a transparent substrate, the chip having sides, a top portion, and a periphery, the mask comprising:
   a recess portion for housing the chip therein;
   a first opening through which a first resin for providing airtight sealing between the chip and the transparent substrate is injected into the recess portion; and
   a second opening through which a second resin is injected so as to be separated from the first resin,
   wherein the chip prevents passage between the first and second openings and
   wherein the airtight sealing of the first resin is formed along the periphery of the first chip so as to cover the sides of said first chip, edge portions of the top portion of said first chip, and gaps between said first chip and the transparent substrate.

7. A solid-state imaging device according to claim 1, wherein the second resin is formed between the top portion of the first chip and the bottom portion of the second chip.

8. The method for producing a solid-state imaging device as recited in claim 5, wherein the step of die bonding the second chip to the first chip using the second resin includes forming said second resin between the top portion of said first chip and the bottom portion of said second chip.

9. The mask as recited in claim 6, wherein the second resin is formed between the top portion of the first chip and the bottom portion of the second chip.

* * * * *